United States Patent [19]
Wu

[11] Patent Number: 6,022,769
[45] Date of Patent: Feb. 8, 2000

[54] METHOD OF MAKING SELF-ALIGNED SILICIDED MOS TRANSISTOR WITH ESD PROTECTION IMPROVEMENT

[75] Inventor: Shye-Lin Wu, Hsinchu, Taiwan

[73] Assignee: Texas Instruments — Acer Incorporated, Hsinchu, Taiwan

[21] Appl. No.: 08/996,694

[22] Filed: Dec. 23, 1997

[51] Int. Cl.[7] .............................................. H01L 21/8238
[52] U.S. Cl. ........................ 438/200; 438/225; 438/655
[58] Field of Search .................................. 438/200, 213, 438/225, 230, 231, 232, 297, 655, 656, 664

[56] References Cited

U.S. PATENT DOCUMENTS

| | | | |
|---|---|---|---|
| 5,246,872 | 9/1993 | Mortensen | 438/200 |
| 5,262,344 | 11/1993 | Mistry | 438/200 |
| 5,498,892 | 3/1996 | Walker et al. | 257/336 |
| 5,559,352 | 9/1996 | Hsue et al. | 257/328 |
| 5,589,423 | 12/1996 | White et al. | 438/664 |
| 5,733,794 | 3/1998 | Gilbert et al. | 438/297 |

OTHER PUBLICATIONS

P. Fornara and A. Poncet, *Modeling of Local Reduction in $TiSi_2$ and $CoSi_2$ Growth Near Spacers in MOS Technologies: Influence of Mechanical Stress and Main Diffusing Species*, 1996, pp. 73–76.

Ajith Amerasekera et al., *Correlating Drain Junction Scaling, Salicide Thickness, and Lateral NPN Behavior, with the ESD/EOS Performance of a 0.25 μm CMOS Process*, 1996, pp. 893–896.

Peng–Heng Chang et al., *On–Liquid–Phase Deposition of Silicon Dioxide by Boric Acid Addition*, Mar. 1997, J. Electrochem. Soc., vol. 144, No. 3, pp. 1144–1149.

*Primary Examiner*—Chandra Chaudhari
*Attorney, Agent, or Firm*—Harness, Dickey & Pierce, P.L.C.

[57] ABSTRACT

An isolation region is formed in a semiconductor substrate for separating a functional region and a ESD protective region. A gate structure and lightly doped active region is formed. An insulator layer is formed and a portion of the layer is removed for a spacer. A doping is performed using the spacer and gate as a mask. An exposed region located aside the gate is defined in the ESD protective region. A covering layer is formed and a first thermal annealing is performed. A junction diode is also formed. A MOS transistor with self-aligned silicide contacts with an ESD protection improvement is formed. The MOS transistor for the ESD protection in a ESD protective region are formed at the same time with the forming of the NMOS, PMOS, or both kind of transistors in a functional region. The ESD protection effect is raised with a low breakdown junction diode. A lightly doped drain (LDD) structure and an ultra-shallow junction are embedded in the devices. The short channel effect and accompanying hot carrier effect is eliminated. ESD damage from external connections to the integrated circuits are kept from the densely packed devices. The salicide technology with low resistance and capacitance provides high gate switching and operation speed with low RC delay. Integrated circuits with ESD hardness, high circuit operation speed, and low power consumption are provided.

27 Claims, 5 Drawing Sheets

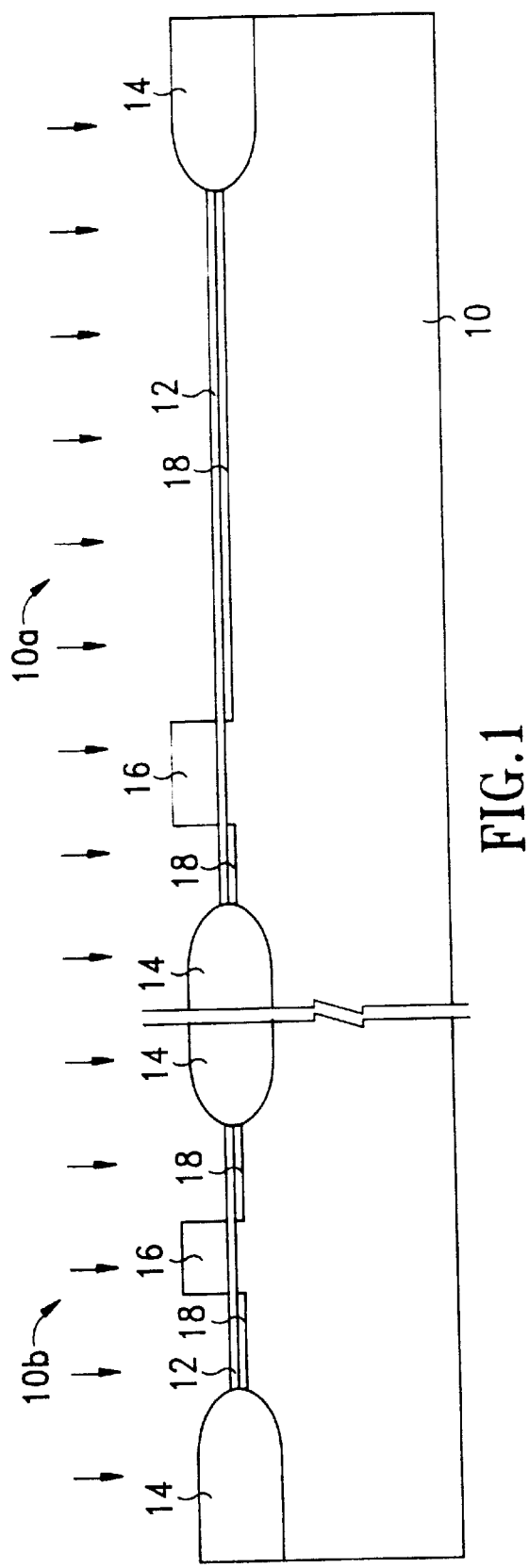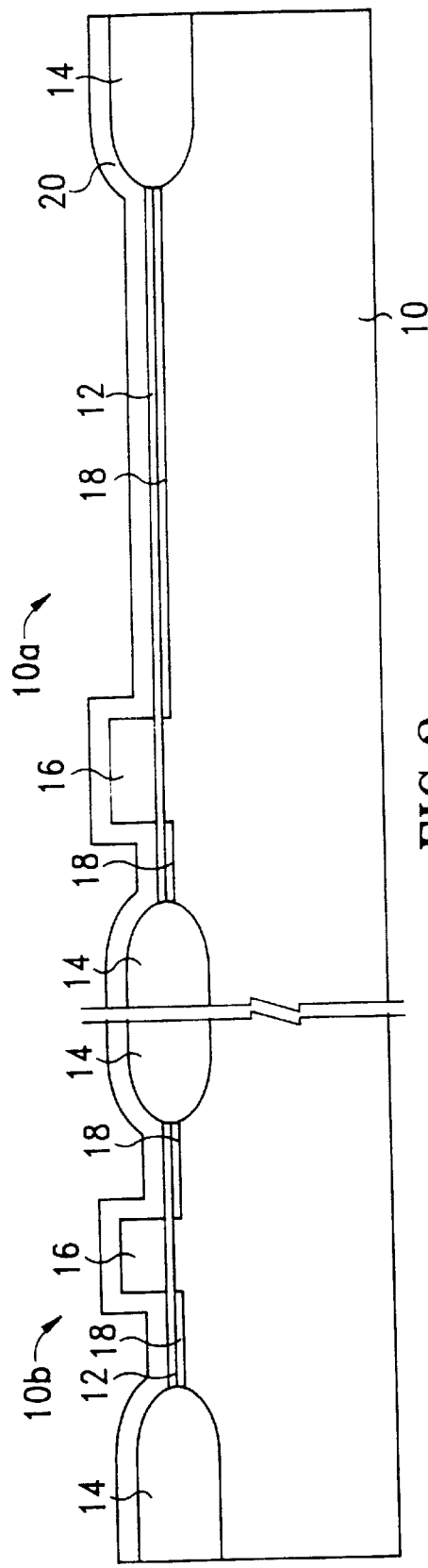

METHOD OF MAKING SELF-ALIGNED SILICIDED MOS TRANSISTOR WITH ESD PROTECTION IMPROVEMENT

FIELD OF THE INVENTION

The present invention relates to the transistors in semiconductor manufacturing, and more specifically, to a method of forming a self-aligned silicided MOS (metal oxide semiconductor) transistor with ESD protection improvement in the semiconductor manufacturing processes.

BACKGROUND OF THE INVENTION

With the progress in the semiconductor integrated circuits reaches to ULSI (ultra large scale integration) level or even higher level, the integrity of the integrated circuits rises in an amazing rate. The capacity of a single semiconductor chip increases from several thousand devices to hundreds of million devices, or even billions of devices. Taking DRAM (dynamic random access memories) for example, the increasing integrity in manufacturing extends the capacity of a single chip to step from earlier 4 megabit to 16 megabit, and further to 256 megabit or even higher. Integrated circuits devices like transistors, capacitors, and connections must be greatly narrowed accompanying with the advancement. The increasing packing density of integrated circuits generates numerous challenges to the semiconductor manufacturing process. Every element or device needs to be formed within smaller area without influencing the characteristics and operations of the integrated circuits. The demands on high packing density, low heat generation, and low power consumption devices with a good reliability and a long operation life must be maintained without any degradation in the function. These achievements are expected to be reached with the simultaneous developments and advancements in the photography, the etching, the deposition, the ion implantation, and the thermal processing technologies, the big five aspects of semiconductor manufacturing. The present technology research focus mainly on the sub-micron and one-tenth micron semiconductor devices to manufacture high reliable and densely arranged integrated circuits.

Transistors, or more particularly metal oxide semiconductor (MOS) transistors, are the most important and frequently employed devices in the integrated circuits. However with the continuous narrowing of device size, the sub-micron scale MOS transistors have to face so many risky challenges. As the MOS transistors become narrower and thinner accompanying with shorter channels, problems like the junction punchthrough, the leakage, and the contact resistance cause the reduction in the yield and reliability of the semiconductor manufacturing processes. The technologies like the self-aligned silicide (salicide) and the shallow junctions are utilized in combating the undesirable effects to manufacture the densely packing devices with good yield.

The electrostatic discharge (ESD) attacking has became a serious problem as the feature size of the MOS transistors scales down. A semiconductor device having the input/output pad connections with external circuitry and devices is subject to the problem of the ESD. The ESD is easily conducted through the input/output and the power lead connections into the internal devices and causes some problems to the semiconductor devices, especially serious ones like the gate oxide breakdown and the overheat damages. The high voltage gradient generated between the contacts and the channels from the ESD causes the gate oxide electron injection and the carrier acceleration effect in the channels. The characteristics and operations of the devices are easily influenced by the inducing effects of the ESD. A high levels of ESD with several hundred volts to a few thousand volts, which is easily transferred to the pins of an IC package during the handling, can bring a permanent destruction to the internal devices. For preventing the devices from the ESD damaging, a built-in ESD protection circuits are connected between the input/output pads and the internal circuitry. A high level of abnormal discharge conducted into the pins of an IC package is kept out by the ESD protection circuits from flowing into the devices. The discharges are guided through the ESD protection circuits to the ground and the damage to the semiconductor devices is eliminated.

Several improvements in combating the ESD problem by forming the ESD protection devices have been provided previously. For example, U.S. Pat. No. 5,559,352 to C. C. Hsue and J. Ko disclosed a method of forming an ESD protection device with reduced breakdown voltage. Their invention employed an lightly implanted region of opposite conductivity type with the source/drain regions centered under the heavier implanted source/drain region. As another example, U.S. Pat. No. 5,498,892 to J. D. Walker and S. C. Gioia disclosed a lightly doped drain ballast resistor. A field effect transistor with an improved electrostatic discharge (ESD) protection using a ballast resistor in the drain region is identified. The ballast resistor laterally distributes current along the width of the drain during an ESD pulse, which reduces local peak current density and reduces damage. But the operation speed problem with small feature size devices is still not solved. In addition, for applying most of the improvements, great efforts are needed with the variations needed in the semiconductor manufacturing circuits and the costs is increased.

In manufacturing the sub-micron feature size semiconductor devices, the salicide technology is a vital application to improve the operation speed of the ULSI/VLSI MOS devices. Unfortunately, there exists some trade-offs in employing the technologies like self-aligned silicide when facing the ESD problem. The devices with the self-aligned silicided contacts shows a worse ESD performance than the non-salicided devices. In general, thicker salicide has a negative effect on the ESD protections and makes the semiconductor devices to be more sensitive to the ESD voltage and to be damaged easily. The details are explored by the investigation of A. Amerasekera et al. ("Correlating Drain Junction Scaling, Salicide Thickness, and Lateral NPN behavior with the ESD/EOS Performance of a 0.25 $\mu$m CMOS Process.", IEDM Tech. Dig., p. 893, IEEE 1996) Their investigation presents the physical mechanisms involved in the degradation of ESD performance with the shallower junctions, the thicker salicides, and the different epitaxial thicknesses. The ESD challenge of salicide technology with the smaller scale devices can be clearly understood by referencing their work.

SUMMARY OF THE INVENTION

A MOS transistor on a semiconductor substrate with a self-aligned silicide and a junction diode for ESD protection improvement is formed with the method of the present invention. The ESD protection devices in the ESD protective region can be formed simultaneously with the NMOS, the PMOS, or both kinds of transistors in the functional region, with only the addition of one lithography process or the variation of the mask in the already existed processes. The lithography process in defining the junction diode of the MOS transistor for ESD protection is quite cost efficient compared with the upcoming advantages. The ESD protection effect is raised with a low breakdown junction diode. A lightly doped drain (LDD) structure and an ultra-shallow junction are embedded in the devices formed by the method. The short channel effect and it's accompanying hot carrier effect is eliminated. ESD damage from external connections to the integrated circuits are kept from the densely packed devices. The self-aligned silicide (salicide) technology employed in the present invention for forming the contacts with both low resistance and capacitance provides high gate switching and operation speed with a low RC delay. Integrated circuits with ESD hardness, high circuit operation speed, and low power consumption of the functional devices are provided by the semiconductor manufacturing process employing the method disclosed.

The method of forming a MOS transistor in a semiconductor substrate with the self-aligned silicide contact for ESD protection includes the following steps. At first, an isolation region is formed in a semiconductor substrate. The isolation region separates the semiconductor substrate into an ESD protective region for one or more transistors, and a functional region for the integrated circuit devices. Then a gate insulator layer is formed on both the ESD protective region and the functional region. A polysilicon layer is formed above following the formation of the gate insulator layer. The polysilicon layer is then patterned to form a gate structure. The semiconductor substrate is doped with a first concentration of a first dopant type using the gate structure as a first doping mask. The doping creates a lightly doped active region with the first type dopants both in the ESD protective region and in the functional region.

Then an insulator layer is formed over the semiconductor substrate and the gate structure. A removing of a portion of the insulator layer and of the gate insulator layer forms a spacer structure surrounding the gate structure. After that, the semiconductor substrate is doped with a second concentration of the first dopant type using the spacer structure and the gate structure as a second doping mask. The doping inserts a plurality of first type dopants into the active region of the ESD protective region and the functional region. An exposed region located aside the gate structure in the ESD protective region is defined by the formation and the patterning of a photoresist layer. The semiconductor substrate is doped with a third concentration of a second dopant type using the photoresist layer as a third doping mask. The doping creates a high dose region with the second type dopants in the exposed region under the active region. A covering layer is formed within the exposed region above the semiconductor substrate. The photoresist layer is then removed.

Then a first thermal annealing is performed to the semiconductor substrate to drive in and activate the plurality of dopants, to form a shallow junction region in a source region and a drain region of the ESD protective region and the functional region. A junction diode in the ESD protective region is also formed. A metal layer is then formed onto the semiconductor substrate. A second thermal annealing is performed to the semiconductor substrate to form a metal silicide layer on the top surface of the gate structure, the top surface of the source region and the top surface of the drain region, and to leave an unreacted metal layer on the isolation region, the spacer structure, and the covering layer. Finally, the unreacted metal layer is removed from the isolation region, the spacer structure, and the covering layer to finish the manufacturing processes.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein:

FIG. 1 illustrates a cross sectional view of the semiconductor substrate with an isolation region, a gate insulator layer and a gate structure on both the ESD protective region and the functional region in the present invention.

FIG. 2 illustrates a cross sectional view of the semiconductor substrate with the formation of an insulator layer on the a semiconductor substrate in the present invention.

DETAILED DESCRIPTION OF THE PREFERRED EMBODIMENT

Figure 3:
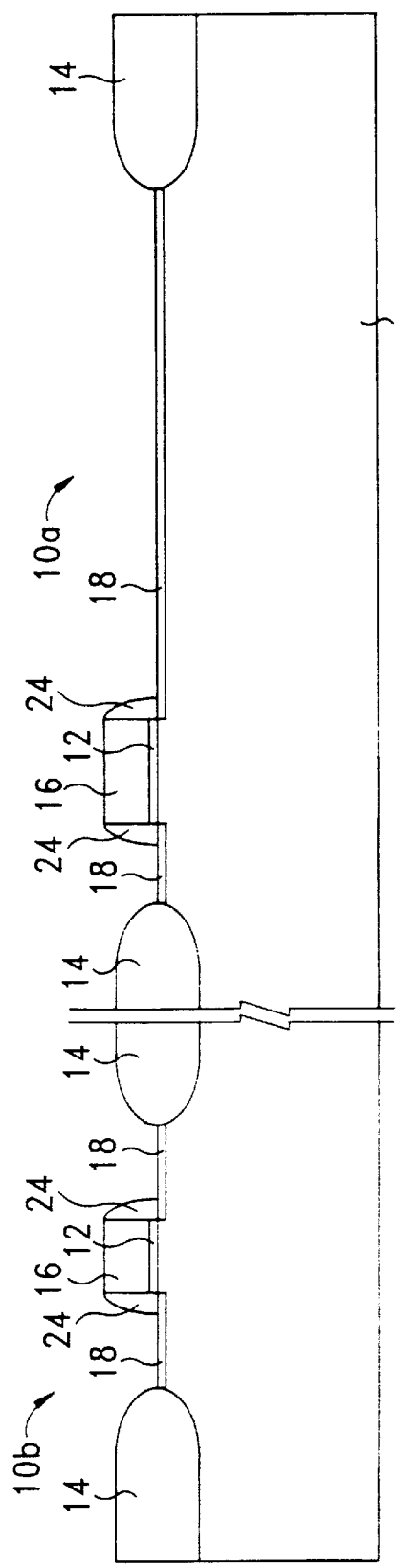
FIG. 3 illustrates a cross sectional view of the semiconductor substrate with the forming and of the spacer structure in the present invention.

A method of forming a self-aligned silicided MOS transistor with an ESD protection improvement in the semiconductor manufacturing processes is provided in the present invention. Via an ESD protection structure and the circuits connecting with the input/output terminals, any undesirable high voltage discharge can be conducted to the ground through the substrate and the internal devices are prevented from the damaging. The method can be incorporated into conventional semiconductor manufacturing processes for manufacturing the NMOS, the PMOS, or both kind of transistors in a functional region. One, or generally more, ESD protection MOS transistors are formed in a ESD protective simultaneously with only slight and cost efficient adjustments of the processes. The transistors in both the ESD protective region and the functional region with a lightly doped drain (LDD) structure and an ultra-shallow junction can be manufactured. The hot carrier effect accompanying with the short channel problems can be eliminated. The self-aligned silicide (salicide) technology employed in the present invention for forming low resistance contacts provides a high operation speed with a low heat generation and a low power consumption. The method for forming the small feature size devices like sub-micron scale devices overcoming present ESD and operation speed challenges is described as following.

The method and the steps in the present invention applied on a semiconductor wafer can create the NMOS transistors and the MOS transistors with ESD protection improvement at the same time. The PMOS transistors can also be build at the same time. Since the variations in the processes for incorporating the formation of the PMOS transistors are well known in the art, the details are not described. Referring to FIG. 1, a semiconductor substrate 10 with a preferable single crystalline silicon in a <100> direction is provided. An isolation region, like the field oxide (FOX) region 14, is formed on the semiconductor substrate. In general, a thin silicon oxide layer 12, as a gate insulator layer, is thermally grown on the semiconductor substrate 10 with the thickness in the range of about 20 Å (angstroms) to 300 Å. A silicon nitride layer, which is not shown in the figure, is then deposited thereon. The silicon nitride layer is utilized as a layer for inhibiting the FOX growth on an active region of the semiconductor substrate. The silicon nitride layer is then patterned to etch off the region for forming the FOX. The semiconductor substrate is subjected to a thermal process, for example, the thermal process performed in a steam and oxygen containing ambient. The region of the silicon oxide layer 12 uncovered by the silicon nitride layer is grown to be the FOX region 14 as an isolation region. The FOX region 14 separates the semiconductor substrate into an ESD protective region 10a for one or more transistors, and a functional region 10b for a plurality of integrated circuit devices. The silicon nitride layer is than removed using etchants like hot phosphoric acid solution. The isolation region can be created through other isolation technologies which are known in the art, like trench isolation and so on, with the same purpose in defining respective active regions.

A polysilicon layer is then deposited with the thickness ranging from about 1,000 Å (angstroms) to 4,000 Å onto the semiconductor substrate 10. As an example, the process like a low pressure chemical deposition (LPCVD) process can be used in forming the polysilicon layer. Then a patterning process is performed to define a polysilicon structure 16 on both the ESD protective region 10a and the functional region 10b, as shown in FIG. 1. The patterning of the polysilicon layer can be done by the method like an anisotropic etching using an etchant within the great variety of choices like $Cl_2$, $BC_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$. A doping process to the semiconductor substrate with a first concentration of a first dopant type is performed using the gate structure 16 as a first doping mask. A lightly doped active region 18 in the ESD protective region 10a and the functional region 10b is created in the doping process employing the process like an ion implantation of phosphorous or arsenic containing ions at an energy between about 10 KeV to 100 KeV, to have a dose between about 1E12 to 1E14 atoms/$cm^2$.

Figure 4:
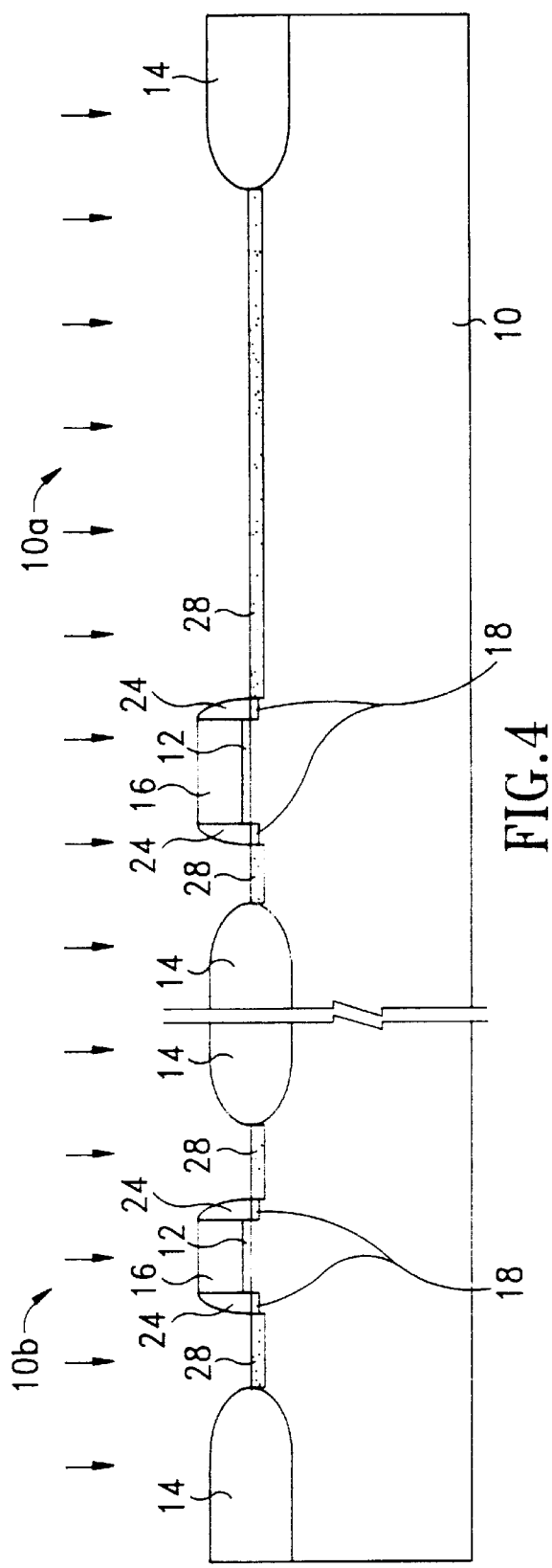
FIG. 4 illustrates a cross sectional view of the semiconductor substrate under the doping with a second concentration of the first dopant type to insert a plurality of dopants into the active region in the present invention.

Referring to FIG. 2, an insulator layer 20 is formed over the semiconductor substrate 10 and is conformal with the gate structure 16. In the case, a silicon oxide layer is deposited by chemical vapor deposition (CVD) with a thickness of about 1,000 Å (angstroms) to 2,000 Å. A portion of the insulator layer 20 and a portion of the gate insulator layer 12 are then removed to forms a spacer structure 24 surrounding the gate structure 16, as shown in FIG. 4. The removing of a portion of the insulator layer 20 and of the gate insulator layer 12 is performed via an etchant taken from $CF_4$, $CCl_2F_2$, $CHF_3/CF_4$, $CHF_3/O_2$, $CH_3CHF_2$ in an anisotropic etching process.

Figure 5:
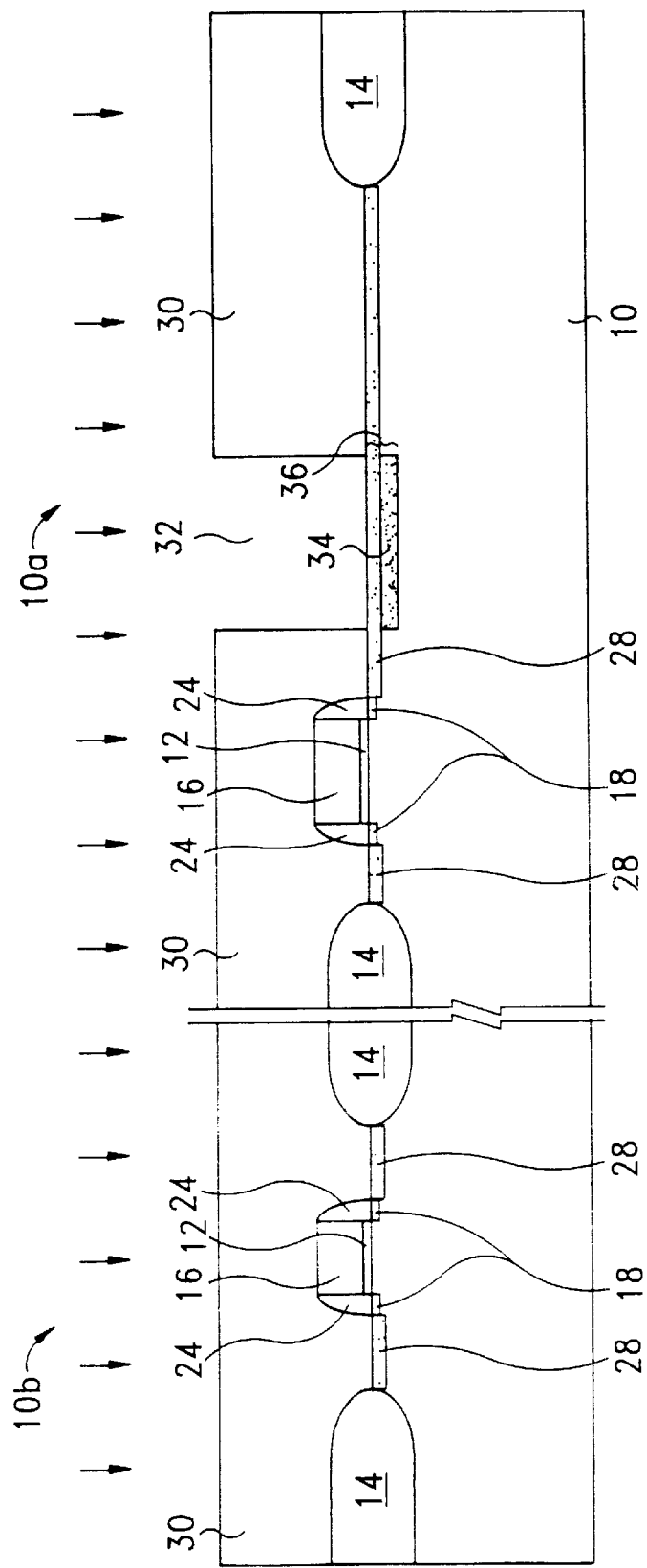
FIG. 5 illustrates a cross sectional view of the semiconductor substrate with the formation of a photoresist layer to define an exposed region in the present invention.

Referring to FIG. 5., following with the formation of the spacer structure 24, another doping process is performed to the semiconductor substrate 10 with a second concentration of the first dopant type. Using the spacer structure 24 and the gate structure 16 as a second doping mask, A process like an ion implantation of phosphorous or arsenic at an energy between about 5 KeV to 80 KeV, to have a dose between about 5E14 to 2E16 atoms/cm is employed. The doping of the uncovered region on both the ESD protective region 10a and the functional region 10b forms an active region 28 containing ions for forming a source region and a drain region on the semiconductor substrate 10.

Figure 6:
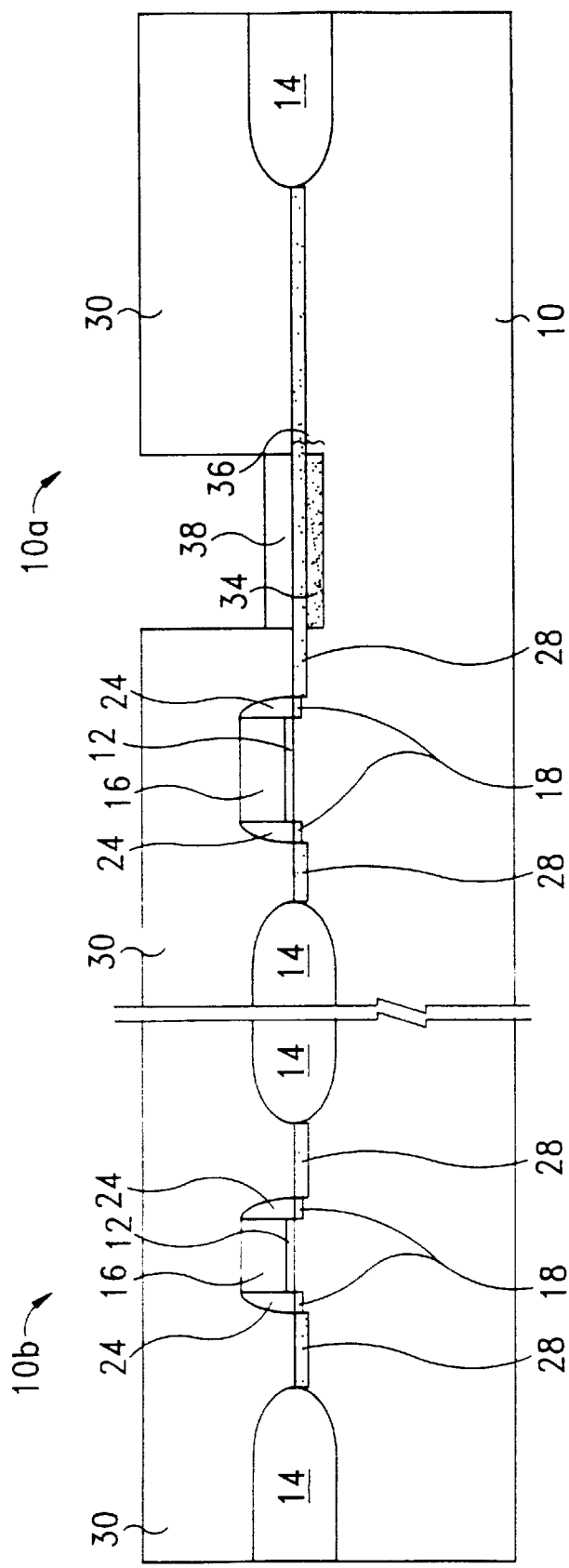
FIG. 6 illustrates a cross sectional view of the semiconductor substrate with the formation of a covering layer within the exposed region in the present invention.

Referring to FIG. 6., a lithography process employing a series of processes like forming, defining, and developing of a photoresist layer 30 is then applied to define an exposed region 32 located aside from the gate structure 16 on the active region 28 of the ESD protective region 10a, as shown in FIG. 3. A third doping process is performed to the semiconductor substrate 10 with a third concentration of the second dopant type. Using the photoresist layer 30 as a third doping mask, a process like an ion implantation of a boron containing dopant like $BF_2$ or boron ions at an energy ranging from about 10 KeV to 150 KeV, to have a dose between about 5E12 to 5E15 atoms/$cm^2$ is employed. Under the defined exposed region 32, the implanted ions compensates the original concentration in the active region and increases the current resistance with the formation of a high dose region 34. Thus a junction diode 36 with a low breakdown voltage is formed by the combination the active region 28 and the high dose region 34.

Following with the formation of the junction diode 36, a covering layer 38 is then formed within the exposed region 32 to cover above the junction diode 36, as shown in FIG. 6. A thin film of a silicon oxide layer is utilized as a covering layer in the preferred embodiment. An efficient way to form the silicon oxide layer with in the exposed region 32 is by a liquid-phase deposition of a silicon oxide (LPD oxide). With the selective deposition characteristics of the LPD oxide only with the proper silicon material like the semiconductor substrate 10, a LPD oxide layer is only formed within the exposed region 32. The photoresist layer 30 acts like a depositing mask during the formation of the covering layer 38. Thus only one lithography process is used in forming both the junction diode 36 and the covering layer 38 on the defined exposed region 32. The photoresist layer 30 is then removed following the formation of the covering layer 38.

A detail understanding of the LPD oxide process can be reached by referencing the investigation of P. H. Chang et al. in their work titled "On Liquid-Phase Deposition of Silicon Dioxide by Boric Acid Addition" (J. Electrochem. Soc., Vol. 144, No. 3, March 1997) In the paper the role of $H_2O$ as a reagent and the detrimental effect of an $SiO_2$ additive as seeds for depleting the nutrient in the growth solution if added after the $H_2O$ addition are emphasized. Several general agreement are reached about the LPD process including the characteristics of the surface controlled process, the rate dependency on the temperature, the constant rate with time, and the influence of the boric acid addition.

Figure 7:
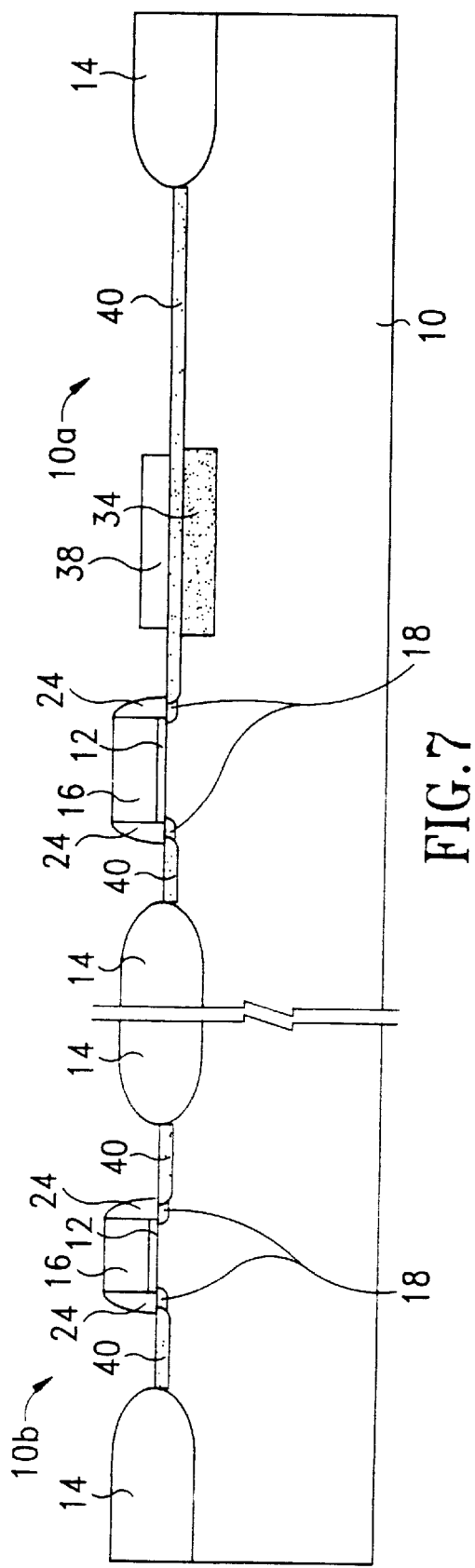
FIG. 7 illustrates a cross sectional view of the semiconductor substrate after a first thermal annealing in the present invention.
Figure 8:
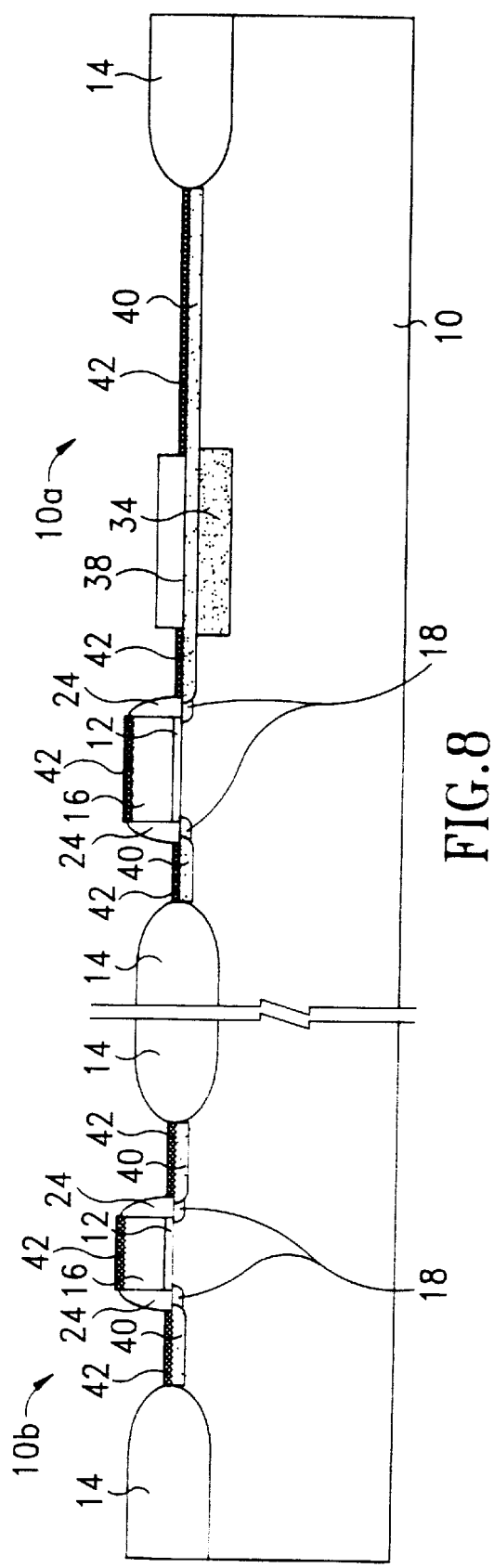
FIG. 8 illustrates a cross sectional view of the semiconductor substrate having a MOS transistor with a self-aligned silicide and a junction diode for the ESD protection in the present invention.

Referring to FIG. 7, a thermal annealing process is performed to the semiconductor substrate 10 to drive in and activate the containing ions in the active region 28. An ultra-shallow junction 40 is formed in the active regions like a source region and a drain region in both the ESD protective region 10a and the functional region 10b. The containing ions in the high dose region 34 is also driven in and activated for combining with the ultra-shallow junction 40 above to act as the aforementioned junction diode 36.

Finally, a self-aligned silicide (salicide) technology is utilized to complete the method of the present invention. A metal layer is formed on the semiconductor substrate using the method like a chemical vapor deposition or a sputtering process generally with a thickness of about 100 Å (angstroms) to 1000 Å. A metal material like Ti, Co, W, Ni, Pt, and etc. can be used. Then a thermal annealing process, preferably a rapid thermal process in a nitrogen ambient with a temperature of about 600° C. to 1000° C., is performed to the semiconductor substrate 10. A metal silicide layer 42 is formed on the top surface of the gate structure 16, the top surface of the source region and the top surface of the drain region. An unreacted metal layer is left on top of the isolation region 14, of the spacer structure 24, and of the covering layer 38. The unreacted metal layer are then removed from the top of the isolation region 14, of the spacer structure 24, and of the covering layer 38 to finish the salicidation process. The removing of the unreacted metal layer can be achieved by an wet etching using a solution containing $NH_4OH$, $H_2O$, and $H_2O_2$ as an example. With the covering layer 38 on the ESD protective region 10$a$, the metal silicide layer 42 can be formed without degrading the ESD protection effect of the circuits. The resistance and capacitance of the contacts or the interconnection paths of the integrated circuits is greatly reduced in both the ESD protective region 10$a$ and the functional region. The following processes after the formation of the salicide, like making the interconnections, the insulation layers and the passivation layers, are dependent with the various specification of the integrated circuits. The processes are well known in the art and not described here.

For a detailed understanding of the self-aligned silicide technology, the modeling made by P. Fornara and A. Poncet ("Modeling of Local Reduction in $TiSi_2$ and $CoSi_2$ Growth Near Spacers in MOS Technologies: Influence of Mechanical Stress and Main Diffusing Species", IEDM Tech. Dig., P. 73, 1996) can be referenced. A comprehensive silicide growth model is developed in identifying the influence of the main diffusing species and mechanical stresses.

A MOS transistor on a semiconductor substrate with a self-aligned silicide and a junction diode for ESD protection improvement is formed with the method of the present invention. The ESD protection devices in the ESD protective region can be formed simultaneously with the NMOS, the PMOS, or both kinds of devices in the functional region, with only the addition of one lithography process, or only the variation in the mask of the already existed processes. The lithography process in defining the junction diode of the MOS transistor for ESD protection is quite cost efficient compared to the advantages addressed. With the formation of a low breakdown junction diode with in the ESD protective region, the undesirable high voltage discharges as high as several thousand volts can be conducted to the ground. The transistors in both the ESD protective region and the functional region with a lightly doped drain (LDD) structure and an ultra-shallow junction can be manufactured. The hot carrier effect accompanying with the short channels can be eliminated. The contacts with low resistance and capacitance forming from a self-aligned silicide (salicide) technology bring minimum RC delay due to the interconnect paths. A high operation or gate switching speed can be achieved with low heat generation and power consumption.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a MOS transistor in a semiconductor substrate, said method comprising the steps of:

forming an isolation region in said semiconductor substrate, said isolation region separating said semiconductor substrate into an ESD protective region for at least one transistor and a functional regions for at least one transistor and a functional region for a plurality of integrated circuit devices;

forming a gate insulator layer on both said ESD protective region and said functional region;

forming a polysilicon layer on said gate insulator layer;

patterning said polysilicon layer to form a gate structure;

doping said semiconductor substrate with a first concentration of a first dopant type using said gate structure as a first doping mask, for forming a lightly doped active region in said ESD protective region and in said functional region;

forming an insulator layer over said semiconductor substrate and said gate structure;

removing a portion of said insulator layer and of said gate insulator layer to form a spacer structure surrounding said gate structure;

doping said semiconductor substrate with a second concentration of said first dopant type using said spacer structure and said gate structure as a second doping mask, for placing a plurality of first type dopants in an active region of said ESD protective region and said functional region;

defining an exposed region located aside said polysilicon gate structure on said active region by forming and patterning a photoresist layer covering above said semiconductor substrate without covering said exposed region;

doping said semiconductor substrate with a third concentration of a second dopant type using said photoresist layer as a third doping mask, for placing a plurality of second type dopants in a high dose region located in said ESD protective region under said exposed region and under said active region;

forming a covering layer on said exposed region;

removing said photoresist layer;

performing a first thermal annealing to said semiconductor substrate to drive in said plurality first type of dopants to form a shallow junction region in a source region and a drain region of said ESD protective region and said functional region;

forming a metal layer on said semiconductor substrate;

performing a second thermal annealing to said semiconductor substrate to form a metal silicide layer on a top surface of said gate structure, a top surface of said source region and a top surface of said drain region, and to leave an unrecalled metal layer on said isolation region, said spacer structure, and said covering layer; and removing said unreacted metal layer from said isolation region, said spacer structure, and said covering layer.

2. The method of claim 1, wherein said isolation region comprises a field oxide isolation, said field oxide isolation being formed by the growth a portion of said semiconductor substrate, to separate said semiconductor substrate into said ESD protective region and said functional region.

3. The method of claim 1, wherein said step of doping with said first concentration of said first dopant type is performed by a first ion implanting process of a plurality of ions, and said step of doping with said second concentration of said first dopant type is performed by a second ion implanting process of said plurality of ions, said first dopant type is selected from the group consisting of an arsenic containing dopant and a phosphorous containing dopant.

4. The method of claim 3, wherein said first ion implanting process of said plurality of ions is implanted at an energy between about 10 KeV to 100 KeV at a dose between about 1E12 to 1E14 atoms/cm$^2$.

5. The method of claim 4, wherein said second ion implanting process of said plurality of ions is implanted at an energy between about 5 KeV to 80 KeV at a dose between about 5E14 to 2E16 atoms/cm$^2$.

6. The method of claim 1, wherein said step of doping with said third concentration of said second dopant type is performed by a third ion implanting process of a plurality of ions, said second dopant type comprising a boron containing dopant, said third ion implanting process of said plurality of boron containing ions is implanted at an energy between about 10 KeV to 150 KeV at a dose between about 5E12 to 5E15 atoms/cm$^2$.

7. The method of claim 1, wherein said gate insulator layer comprises a silicon oxide which is grown thermally in an oxygen ambient on said semiconductor substrate to a thickness of about 20 Å (angstroms) to 300 Å.

8. The method of claim 1, wherein said polysilicon layer is deposited in a chemical vapor deposition process with a thickness of about 1,000 Å (angstroms) to 4,000 Å.

9. The method of claim 1, wherein said step of patterning said polysilicon layer is achieved with an anisotropic etching using an etchant which is selected from the group of $Cl_2$, $BCl_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$.

10. The method of claim 1, wherein said step of removing a portion of said insulator layer and said gate insulator layer is performed with an etchant which is selected from the group of $CF_4$, $CCl_2F_2$, $CHF_3/CF_4$, $CHF_3/O_2$, $CH_3CHF_2$ in an anisotropic etching.

11. The method of claim 1, wherein said insulator layer comprises a silicon oxide layer which is deposited with a thickness of about 1,000 Å (angstroms) to 2,000 Å.

12. The method of claim 1, wherein said covering layer is formed by a liquid phase deposition of a thin silicon dioxide layer which is deposited with a thickness of about 300 Å (angstroms) to 1,500 Å.

13. The method of claim 1, wherein said metal layer comprises a metal selected from the group consisting of Ti, Co, W, Ni and Pt.

14. The method of claim 1, wherein said second thermal annealing for forming a metal silicide layer is performed with a rapid thermal process in a nitrogen ambient with a temperature of about 600° C. to 1,000° C.

15. The method of claim 1, wherein said step of removing said unreacted metal layer from said isolation region, said spacer structure, and said covering layer is achieved by the wet etching of a solution containing $NH_4OH$, $H_2O$ and $H_2O_2$.

16. A method of forming a MOS transistor in a semiconductor substrate, said method of comprising the steps of:

forming an isolation region in said semiconductor substrate, said isolation region comprises a field oxide isolation, said field oxide isolation being formed by the growth a portion of said semiconductor substrate, to separate said semiconductor substrate into an ESD protective region for at least one transistor and a functional region for a plurality of integrated circuit devices;

forming a gate insulator layer on both said ESD protective region and said functional region;

forming a polysilicon layer on said gate insulator layer;

patterning said polysilicon layer to form a gate structure;

doping said semiconductor substrate with a first concentration of a first dopant type using said gate structure as a first doping mask, for forming a lightly doped active region in said ESD protective region and in said functional region;

forming an insulator layer over said semiconductor substrate and said gate structure;

removing a portion of said insulator layer and of said gate insulator layer to form a spacer structure surrounding said gate structure;

doping said semiconductor substrate with a second concentration of said first dopant type using said spacer structure and said gate structure as a second doping mask, for placing a plurality of first type dopants in an active region of said ESD protective region and said functional region;

defining an exposed region located aside said polysilicon gate structure on said active region by forming and patterning a photoresist layer covering above said semiconductor substrate without covering said exposed region;

doping said semiconductor substrate with a third concentration of a second dopant type using said photoresist layer as a third doping mask, for placing a plurality of second type dopants in a high dose region, said high dose region located in said ESD protective region under said exposed region and under said active region;

forming a covering layer on said exposed region, said covering layer being formed by a liquid phase deposition of a thin silicon dioxide layer which is deposited with a thickness of about 300 Å (angstroms) to 1500 Å;

removing said photoresist layer;

performing a first thermal annealing to said semiconductor substrate to drive in said plurality first type of dopants to form a shallow junction region in a source region and a drain region of said ESD protective region and said functional region;

forming a metal layer on said semiconductor substrate, said metal layer comprises a metal selected from the group consisting of Ti, Co, W, and Pt;

performing a second thermal annealing to said semiconductor substrate to form a metal silicide layer on a top surface of said gate structure, a top surface of said source region and a top surface of said drain region, and to leave an unreacted metal layer on said isolation region, said spacer structure, and said covering layer; and removing said unreacted metal layer from said isolation region, said spacer structure, and said covering layer.

17. The method of claim 16, wherein said step of doping with said first concentration of said first dopant type is performed by a first ion implanting process of a plurality of ions, and said step of doping with said second concentration of said first dopant type is performed by a second ion implanting process of said plurality of ions, said first dopant type is selected from the group consisting of an arsenic containing dopant and a phosphorous containing dopant.

18. The method of claim 17, wherein said first ion implanting process of said plurality of ions is implanted at an energy between about 10 KeV to 100 KeV at a dose between about 1E12 to 1E14 atoms/cm$^2$.

19. The method of claim 18, wherein said second ion implanting process of said plurality of ions is implanted at an energy between about 5 KeV to 80 KeV at a dose between about 5E14 to 2E16 atoms/cm$^2$.

20. The method of claim 16, wherein said step of doping with said third concentration of said second dopant type is performed by a third ion implanting process of a plurality of ions, said second dopant type comprising a boron containing dopant, said third ion implanting process of said plurality of boron containing ions is implanted at an energy between about 10 KeV to 150 KeV at a dose between about 5E12 to 5E15 atoms/cm$^2$.

21. The method of claim 16, wherein said gate insulator layer comprises a silicon oxide which is grown thermally in an oxygen ambient on said semiconductor substrate to a thickness of about 20 Å (angstroms) to 300 Å.

22. The method of claim 16, wherein said polysilicon layer is deposited in a chemical vapor deposition process with a thickness of about 1,000 Å (angstroms) to 4,000 Å.

23. The method of claim 16, wherein said step of patterning said polysilicon layer is achieved with an anisotropic etching using an etchant which is selected from the group of $Cl_2$, $BCl_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$.

24. The method of claim 16, wherein said step of removing a portion of said insulator layer and said gate insulator layer is performed with an etchant which is selected from the group of $CF_4$, $CCl_2F_2$, $CHF_3/CF_4$, $CHF_3/O_2$, $CH_3CHF_2$ in an anisotropic etching.

25. The method of claim 16, wherein said insulator layer comprises a silicon oxide layer which is deposited with a thickness of about 1,000 Å (angstroms) to 2,000 Å.

26. The method of claim 16, wherein said second thermal annealing for forming a metal silicide layer is performed with a rapid thermal process in a nitrogen ambient with a temperature of about 600° C. to 1,000° C.

27. The method of claim 16, wherein said step of removing said unreacted metal layer from said isolation region, said spacer structure, and said covering layer is achieved by the wet etching of a solution containing $NH_4OH$, $H_2O$, and $H_2O_2$.

* * * * *